United States Patent
Ando et al.

(10) Patent No.: US 9,099,393 B2
(45) Date of Patent: Aug. 4, 2015

(54) ENABLING ENHANCED RELIABILITY AND MOBILITY FOR REPLACEMENT GATE PLANAR AND FINFET STRUCTURES

(71) Applicants: INTERNATIONAL BUSINESS MACHINES CORPORATION, Armonk, NY (US); GLOBALFOUNDARIES Inc., Cayman Islands (KY)

(72) Inventors: Takashi Ando, Tuckahoe, NY (US); Eduard A. Cartier, New York, NY (US); Kisik Choi, Watervliet, NY (US); Wing L. Lai, Williston, VT (US); Vijay Narayanan, New York, NY (US); Ravikumar Ramachandran, Pleasantville, NY (US)

(73) Assignees: INTERNATIONAL BUSINESS MACHINES CORPORATION, Armonk, NY (US); GLOBALFOUNDRIES Inc., Cayman Islands (KY)

( * ) Notice: Subject to any disclaimer, the term of this patent is extended or adjusted under 35 U.S.C. 154(b) by 3 days.

(21) Appl. No.: 13/959,375

(22) Filed: Aug. 5, 2013

(65) Prior Publication Data

US 2015/0035073 A1     Feb. 5, 2015

(51) Int. Cl.
  *H01L 21/28* (2006.01)
  *H01L 27/092* (2006.01)
(52) U.S. Cl.
  CPC ........ *H01L 21/28229* (2013.01); *H01L 27/092* (2013.01)
(58) Field of Classification Search
  CPC ................... H01L 21/28202; H01L 21/28176; H01L 21/823842

USPC .................................. 438/183, 216, 287, 591
  See application file for complete search history.

(56) References Cited

U.S. PATENT DOCUMENTS

| | | | |
|---|---|---|---|
| 6,921,711 B2 | 7/2005 | Cabral, Jr. et al. | |
| 7,411,237 B2 | 8/2008 | Ahn et al. | |
| 7,785,958 B2 | 8/2010 | Doczy et al. | |
| 8,404,530 B2 | 3/2013 | Ando et al. | |
| 2011/0147831 A1 | 6/2011 | Steigerwald et al. | |
| 2012/0280288 A1* | 11/2012 | Ando et al. | 257/288 |
| 2013/0256802 A1* | 10/2013 | Jagannathan et al. | 257/368 |
| 2014/0120707 A1 | 5/2014 | Ando et al. | |

OTHER PUBLICATIONS

Ando, T. "Ultimate Scaling of High-K Gate Dielectrics: Higher-K or Interfacial Layer Scavenging?" Materials, vol. 5, No. 3. Mar. 2012. pp. 478-500.

Copel, M., et al. "Interaction of LA2O3 Capping Layers With HFO2 Gate Dielectrics" Applied Physics Letters, vol. 95. Nov. 2009. (3 Pages).

Gusev, E. et al. "Advanced High-K Dielectric Stacks With Polysi and Metal Gates: Recent Progress and Current Challenges" IBM Journal of Research and Development, vol. 50. No. 4.5. Jul. 2006. pp. 387-410.

* cited by examiner

*Primary Examiner* — Daniel Whalen
(74) *Attorney, Agent, or Firm* — Tutunjian & Bitetto, P.C.; Vazken Alexanian (57) ABSTRACT

A method for semiconductor fabrication includes forming at least one of a diffusion barrier layer and a metal containing layer over a dielectric layer in a gate cavity. A first anneal is performed to diffuse elements from the at least one of the diffusion barrier layer and the metal containing layer into the dielectric layer. The metal containing layer and the diffusion barrier layer are removed. A second anneal is performed to adjust diffusion of the elements in the dielectric layer to provide a gate dielectric region.

14 Claims, 9 Drawing Sheets

ENABLING ENHANCED RELIABILITY AND MOBILITY FOR REPLACEMENT GATE PLANAR AND FINFET STRUCTURES

BACKGROUND

1. Technical Field

The present invention relates to semiconductor fabrication, and more particularly to enabling enhanced reliability and mobility for replacement gate planar and FinFET structures.

2. Description of the Related Art

Incorporation of lanthanum oxide (La2O3) into high-k dielectric improves positive bias temperature instabilities (PBTI) and time-dependent dielectric breakdown (TDDB) on replacement gate fin field effect transistor (FinFET) and planar devices. However, there are multiple issues associated with this process. The electron mobility of n-type field effect transistor (nFET) devices is degraded potentially due to additional coulombic scatters, such as interface state generation and other traps from the formation of a La2O3/SiO2 interfacial dipole. The process of integrating the La2O3 into a functioning CMOS (complementary metal-oxide-semiconductor) flow results in negative bias temperature instabilities (NBTI) degrade due to excess nitrogen incorporation within the interfacial film. There are currently no known solutions to these problems.

SUMMARY

A method for semiconductor fabrication includes forming at least one of a diffusion barrier layer and a metal containing layer over a dielectric layer in a gate cavity. A first anneal is performed to diffuse elements from the at least one of the diffusion barrier layer and the metal containing layer into the dielectric layer. The metal containing layer and the diffusion barrier layer are removed. A second anneal is performed to adjust diffusion of the elements in the dielectric layer to provide a gate dielectric region.

A method for semiconductor fabrication includes forming a dielectric layer in gate cavities associated with first and second device regions. A second diffusion barrier layer is formed over a metal containing layer, which is formed over the dielectric layer in the first device region. A first diffusion barrier layer is formed over the dielectric layer in the second device region. A first anneal is performed to diffuse elements from the second diffusion barrier layer and the metal containing layer into the dielectric layer in the first device region, and from the first diffusion barrier into the dielectric layer in the second device region. The second diffusion barrier, the metal containing layer, and the first diffusion barrier are removed. A second anneal is performed to adjust diffusion of the elements in the dielectric layer to provide a gate dielectric region.

A semiconductor device includes a substrate having a plurality of regions including a first region and a second region. A first gate structure is formed in the first region including a first dielectric layer, which has a top layer, middle layer, and bottom layer of the first dielectric layer, the top layer of the first dielectric layer including hafnium (Hf), lanthanum (La), oxygen (O), and nitrogen (N), the middle layer of the first dielectric layer including La, silicon (Si), O, and N, and the bottom layer of the first dielectric layer including undoped silicon dioxide. A second gate structure is formed in the second region including a second dielectric layer, which has a top layer, middle layer, and bottom layer of the second dielectric layer, the top layer of the second dielectric layer including Hf, O, and N, the middle layer of the second dielectric layer including Si, O, and N, and the bottom layer of the second dielectric layer including undoped silicon dioxide.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, semiconductor devices and methods for fabricating semiconductor devices are provided. For replacement gate fin field effect transistors (finFET) and planar devices, the incorporation of lanthanum oxide (La2O3) results in a mobility degrade due to the La2O3/SiO2 dipole. The present principles provide an additional high temperature anneal after incorporation of the lanthanum oxide to provide additional SiO2 regrowth, which moves the dipole position further away from the gate dielectric/channel interface and helps mitigate the mobility degrade. This additional anneal also enables a reduction in the amount of nitrogen incorporated into the interfacial layer (during TiN barrier deposition and first anneal) on p-type field effect transistors (pFETs), thereby helping to develop a comprehensive performance and reliability enhancing solution for replacement gate structures. The present principles enable enhanced reliability and mobility for replacement gate planar (including bulk partially depleted semiconductor on insulator (SOI) or fully depleted SOI) and finFET/trigate structures.

The flowchart and block diagrams in the Figures illustrate the architecture, functionality, and operation of possible implementations of systems and methods according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
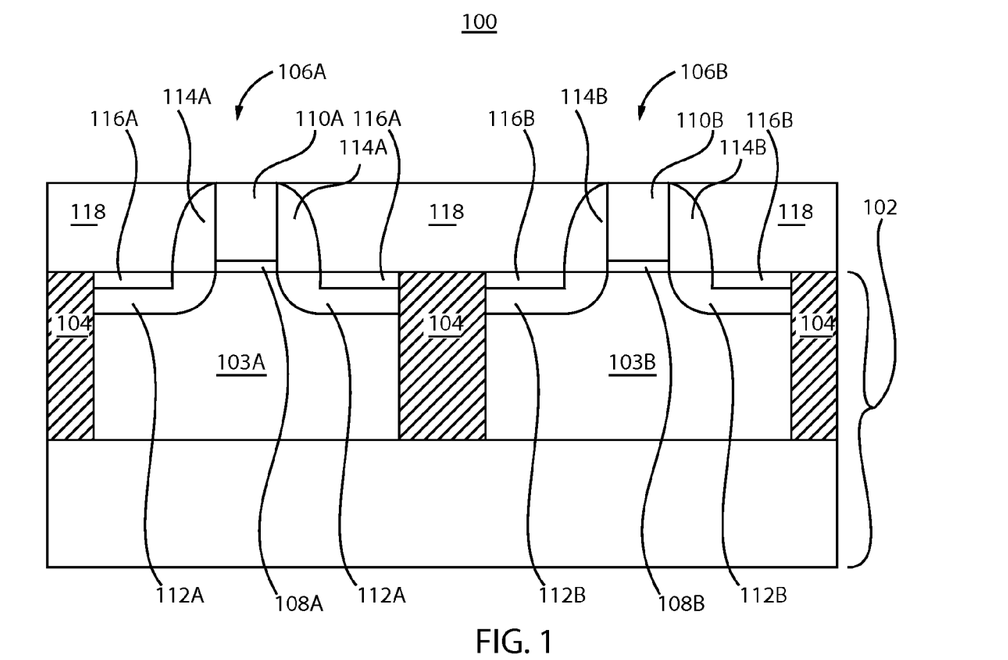
FIG. 1 is a cross-sectional view of a semiconductor structure having disposable gate structures, in accordance with one illustrative embodiment.

Referring now to the drawings in which like numerals represent the same or similar elements and initially to FIG. 1, a semiconductor device 100 is illustratively depicted in accordance with one embodiment. The semiconductor structure 100 is formed in a semiconductor substrate 102, which may include bulk silicon, monocrystalline silicon, germanium, gallium arsenide, or any other suitable material or combination of materials. Substrate 102 may also include a semiconductor-on-insulator (SOI) substrate (not shown) including a top SOI layer, a buried oxide (BOX) layer formed below the top SOI layer, and a bottom semiconductor layer formed below the BOX layer.

Portions of the semiconductor material in the substrate 102 can be doped with electrical dopants of n-type or p-type at different dopant concentration levels to form one or more wells 103A, 103B. For example, a first doped well 103A may be formed in a first device region 106A and a second doped well 103B may be formed in a second device region 106B. Each of the wells 103A, 103B can be independently doped by, e.g., implantation which may involve a mask to cover protected regions (not shown). In a preferred embodiment, doped well 103A is doped with a p-type dopant (e.g., e.g., Boron, Gallium, Indium, etc.) in first device region 106A and doped well 103B is doped with an n-type dopant (e.g., Phosphorous, Arsenic, Antimony, etc.) in second device region 106B.

Shallow trench isolation (STI) dielectric regions 104 may be formed by conventional methods to electrically separate devices and reduce parasitic currents and charge buildup. STI regions 104 may include an oxide, e.g., a silicon oxide.

Disposable gate structures are formed over substrate 102 by deposition and lithographic patterning. Disposable gate structures include a disposable dielectric layer 108A, 108B and a disposable gate electrode 110A, 110B. The disposable gate dielectric 108A, 108B may include a dielectric material, such as, e.g., a semiconductor oxide. The disposable gate electrode 110A, 110B may include any conductive material. The disposable gate electrode 110A, 110B preferably include a material that can be subsequently removed selective to dielectric material.

Source/drain regions 112A, 112B are formed by implantation (not shown), which may involve a mask to protect portions of the device 100. First electrical dopants are implanted into source/drain regions 112A and second electrical dopants are implanted into source/drain regions 112B. Preferably, the first electrical dopants have an opposite polarity as doped well 103A, and the second electrical dopants have an opposite polarity as doped well 103B. For example, the doped well 103A may be an n-type well and the first electrical dopants may be p-type dopants, while the doped well 103B may be a p-type well and the first electrical dopants may be n-type dopants.

Spacers 114A, 114B may be formed around the sidewalls of the disposable gate structures. The spacers 114A, 114B may include a nitride, for example. The spacers 114A, 114B may be formed by deposition and etching.

Metal semiconductor alloy portions 116A, 116B are formed on exposed portions of semiconductor material on the top surface of the semiconductor substrate 102 by, e.g., deposition of a metal layer and an anneal (not shown). Unreacted portions of the metal layer are removed selective to reacted portions of the metal layer. The reacted portions of the metal layer constitute the metal semiconductor alloy portions 116A, 116B.

A planarization dielectric layer 118 is deposited on exposed portions of the semiconductor device 100. Preferably, the planarization dielectric layer 118 includes a dielectric material that may be easily planarized (e.g., doped or undoped silicate glass). The planarization dielectric layer 118 is preferably planarized to the topmost surface of the disposable gate structures 106A, 106B, i.e., above the surface of the gate electrode 110A, 110B. Planarization may include, e.g., chemical mechanical planarization (CMP).

Processing of the semiconductor structure 100 may continue to form additional features or structures. In some embodiments, the semiconductor structure 100 further comprises other features or structures that are formed in previous process steps.

Figure 2:
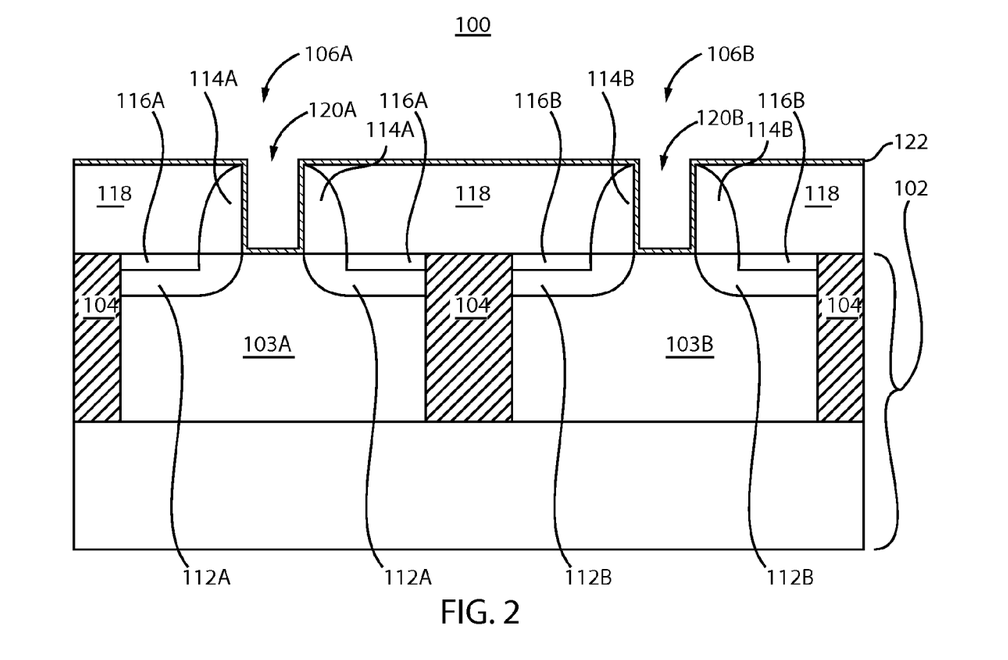
FIG. 2 is a cross-sectional view of the semiconductor structure have disposable gate structures removed and a dielectric layer formed thereon, in accordance with one illustrative embodiment.

Referring now to FIG. 2, processing of semiconductor device 100 continues. The disposable gate structures (108A, 108B; 110A, 110B) are removed by etching, which may include, e.g., a recess etch such as an isotropic etch or anisotropic etch. The etch is preferably selective to the planarization dielectric layer 118 and spacers 114A, 114B. The etch removes disposable gate electrodes 110A, 110B and disposable gate dielectric 108A, 108B to expose semiconductor surfaces above the channel regions to form gate cavities 120A, 120B. Optionally, an interfacial dielectric layer (not shown) may be formed on exposed surfaces of the cavities 120A, 120B.

A gate dielectric layer 122 is formed over exposed portions of device 100. The gate dielectric 122 includes a first layer (not shown) and a second layer formed above the first layer. The first layer preferably includes, e.g., silicon dioxide ($SiO_2$) or silicon oxynitride (SiON). The first $SiO_2$ layer may be formed by growth by first exposing the silicon in the cavities 120A, 120B with oxygen. The second layer preferably includes hafnium (IV) oxide ($HfO_2$), however may include any other suitable dielectric metal oxides (i.e., high-k gate dielectric material), such as, e.g., $ZrO_2$, $La_2O_3$, $Al_2O_3$, etc. The second $HfO_2$ layer may be formed by deposition over the surface of device 100. Dielectric metal oxides can be deposited by chemical vapor deposition (CVD), physical vapor deposition (PVD), molecular beam deposition (MBD), pulsed laser deposition (PLD), liquid source missed chemical deposition (LSMCD), atomic layer deposition (ALD), etc. The thickness of the first layer with gate dielectric layer 122 can range from, e.g., 0.5 nm to 1.2 nm. The thickness of the second layer within the gate dielectric layer 122 can range from, e.g., 1 nm to 4 nm, measured at horizontal portions, although other thicknesses may also be employed. A post deposition anneal is then performed at a range of about, e.g., 600 degrees Celsius (° C.) to 1250° C. The post deposition anneal may include, e.g., a rapid thermal anneal (RTA) or a millisecond anneal, such as a laser anneal or flash lamp anneal.

Figure 3:
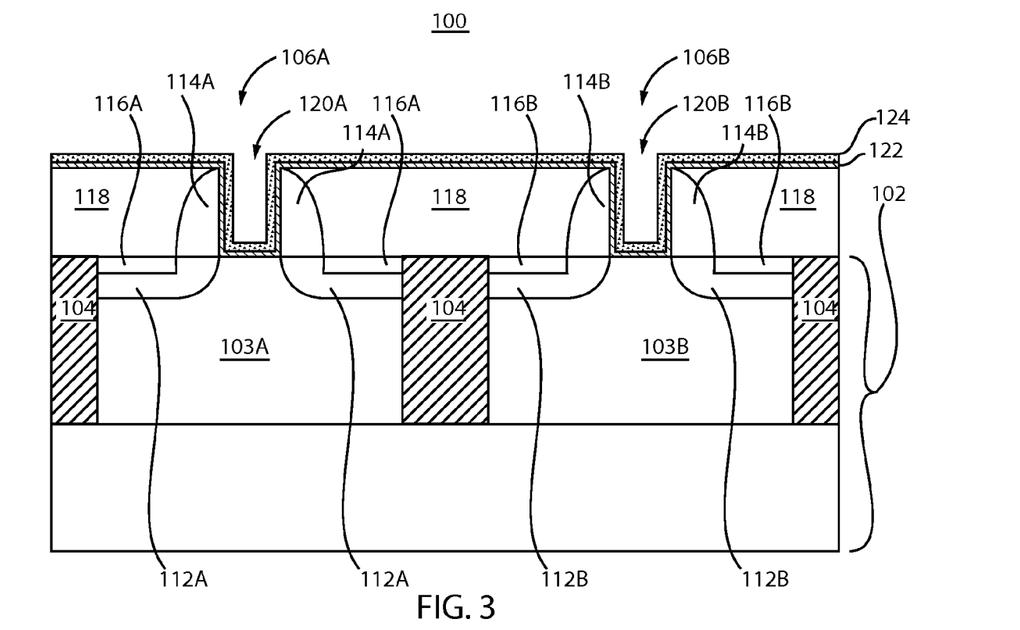
FIG. 3 is a cross-sectional view of the semiconductor structure having a diffusion barrier layer formed over the dielectric layer, in accordance with one illustrative embodiment.

Referring now to FIG. 3, a diffusion barrier layer 124 is formed over the surface of the gate dielectric layer 122. The diffusion barrier layer 124 preferably includes a material that prevents the diffusion of metallic elements. In a preferred embodiment, the diffusion barrier layer 124 includes titanium nitride (TiN). However, the diffusion barrier layer 124 may include any other suitable material, such as, e.g., metallic nitride (e.g., TaN, WN) or metallic carbide. The diffusion barrier layer 124 is deposited by, e.g., PVD, ALD, CVD, etc. The thickness of the diffusion barrier layer 124 can range from, e.g., 1 nm to 10 nm, measured at horizontal portions, although other thicknesses may also be employed.

Figure 4:
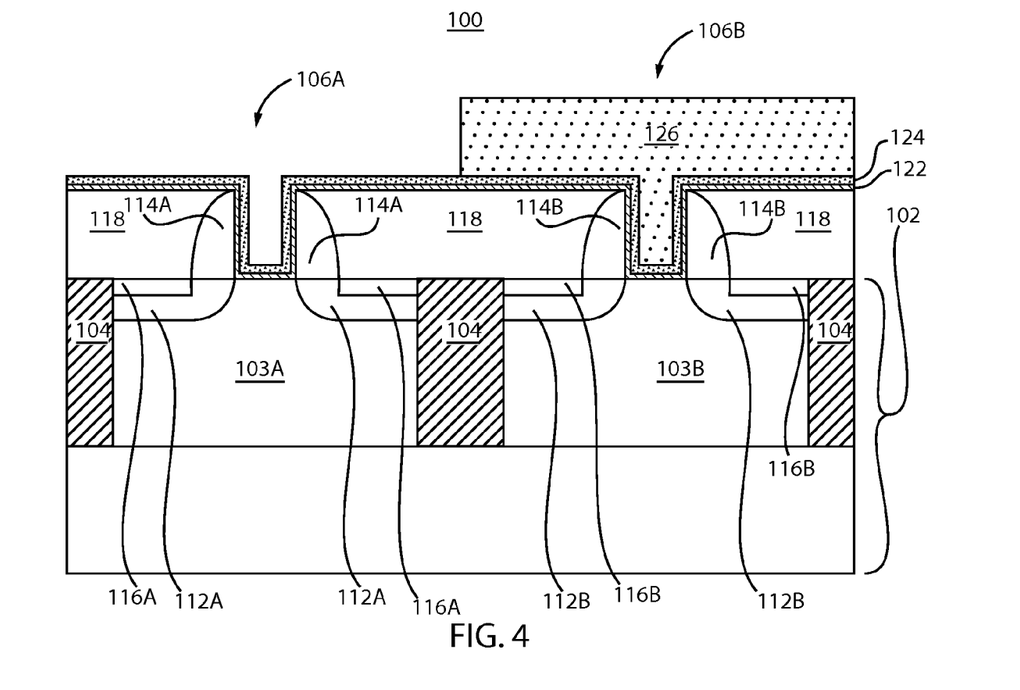
FIG. 4 is a cross-sectional view of the semiconductor structure having the diffusion barrier layer lithographically patterned, in accordance with one illustrative embodiment.

Referring now to FIG. 4, the diffusion barrier layer 124 is patterned. A photoresist layer 126 may be lithographically patterned by exposure and development. The photoresist layer is removed from the first device region 106A and remains in the second device region 106B. The photoresist layer 126 is employed as a mask to etch exposed portions (i.e., the first device region 106A) of the diffusion barrier layer 124. The photoresist layer 126 is subsequently removed, e.g., by ashing.

Figure 5:
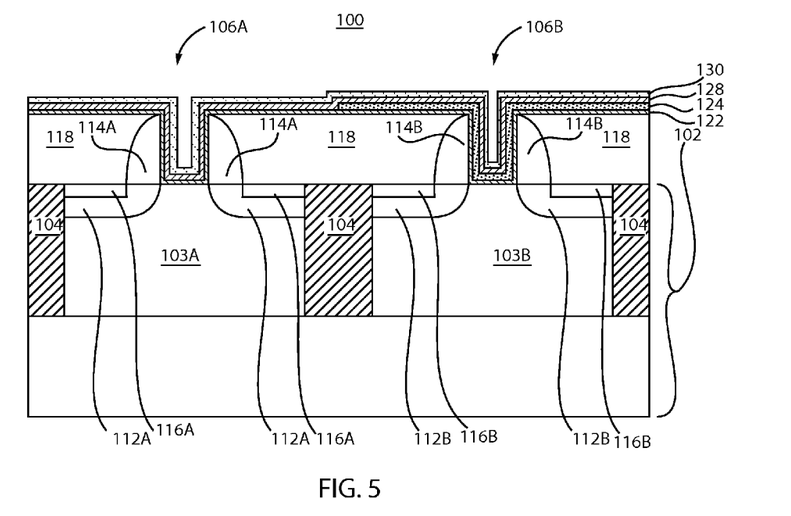
FIG. 5 is a cross-sectional view of the semiconductor structure having a metal containing layer and a diffusion barrier layer formed thereon, in accordance with one illustrative embodiment.

Referring now to FIG. 5, a metal containing layer 128 and a diffusion barrier cap layer 130 are sequentially deposited over the device 100. The metal containing layer 128 includes at least one metallic element that can dope the gate dielectric layer 122 to alter the dielectric characteristics of the dielectric material. Preferably, the metal containing layer includes a metal oxide layer, such as, e.g., lanthanum oxide ($La_2O_3$). However, the metal containing layer 128 may also include, e.g., Group IIA elements and other Group IIIB elements. The metal containing layer 128 may be deposited by, e.g., PVD, CVD, ALD, etc. The thickness of the metal containing layer 128 can range from, e.g., 0.2 nm to 1.5 nm, measured at horizontal portions, although other thicknesses may also be employed.

The diffusion barrier cap layer 130 may include a metallic material that prevents outdiffusion of material of the metal containing layer 128 during the subsequent anneal step. The diffusion barrier cap layer 130 preferably includes titanium nitride, but can also include other metal nitrides, metal carbide (e.g., TaN, WN, TiC, TaC, WC), etc. The diffusion barrier cap layer 130 may be deposited by, e.g., PVD, CVD, ALD, etc. The thickness of the diffusion barrier layer 130 can range from, e.g., 1 nm to 10 nm, measured at horizontal portions, although other thicknesses may also be employed.

Figure 6:
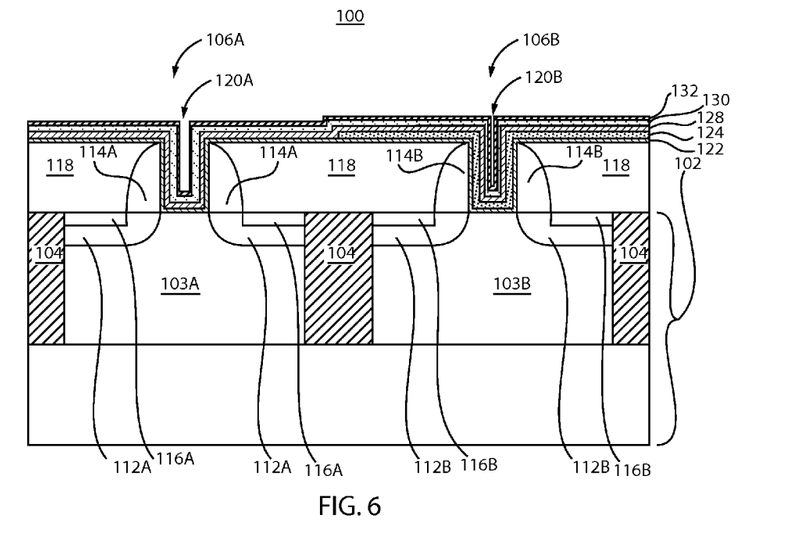
FIG. 6 is a cross-sectional view of the semiconductor structure having a semiconductor layer formed over the diffusion barrier layer, in accordance with one illustrative embodiment.

Referring now to FIG. 6, a semiconductor layer 132 can be deposited over the diffusion barrier layer 130. The semiconductor layer 132 may include a semiconductor material, such as, e.g., silicon or germanium. Preferably, the semiconductor layer 132 includes amorphous silicon. The semiconductor layer 132 is deposited by, e.g., CVD. The thickness of the semiconductor layer 132 can range from, e.g., 2 nm to 40 nm, measured at horizontal portions, although other thicknesses may also be employed. The gate cavities 120A, 120B are not completely filled at this stage so that the inner surfaces of the semiconductor layer 132 are physically exposed within the gate cavities 120A, 120B.

A first anneal (not shown) is performed at an elevated temperature to induce diffusion of the metallic element(s) from the metal containing layer 128 toward gate dielectric layer 122. The first anneal is preferably a rapid thermal anneal (RTA) performed at a temperature ranging, e.g., from 950° C. to 1,050° C., although other temperatures may also be employed.

In the first device region 106A, the metal containing layer 128 is in contact with the gate dielectric layer 122. Thus, the metallic element(s) within the metal containing layer 128 diffuse into the portion of the gate dielectric layer 122 that contacts the metal containing layer 128. Preferably, the metallic elements of the metal containing layer 128 (e.g., La2O3) and the diffusion barrier layer 124 (e.g., N from TiN) partially diffuses through the second layer (e.g., HfO2) of the gate dielectric layer 122. The semiconductor layer is a diffusion barrier against incorporation of any oxygen from within the annealing ambient which may result in unwanted and uncontrolled SiO2 regrowth.

In the second device region 106B, the diffusion barrier layer 124 blocks the diffusion of metallic elements (e.g., La) from the metal containing layer 128 (e.g., La2O3) to the gate dielectric layer 122. Thus, only elements from the diffusion barrier layer 124 (e.g., such as N from the TiN) partially diffuse through the second layer of the gate dielectric 122 and a portion of the first layer of the gate dielectric layer 122.

Figure 7:
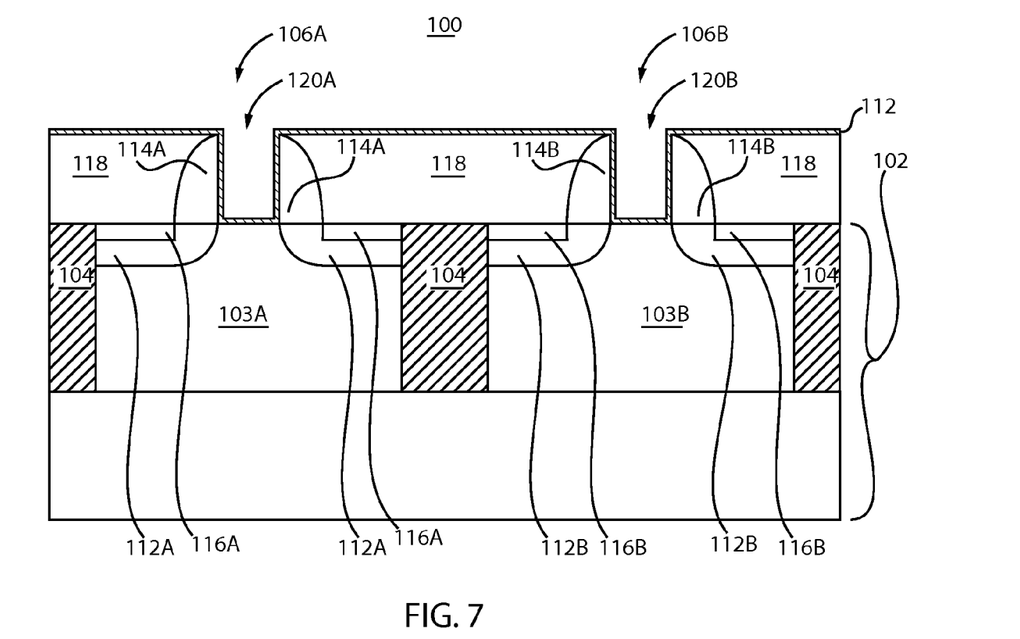
FIG. 7 is a cross-sectional view of the semiconductor structure having the semiconductor layer, diffusion barrier layers, and metal containing layers removed, in accordance with one illustrative embodiment.

Referring now to FIG. 7, the semiconductor layer 132, diffusion barrier cap layer 130, metal containing layer 128, and diffusion barrier layer 124 are sequentially removed. Removal may include employing an etch.

Figure 8:
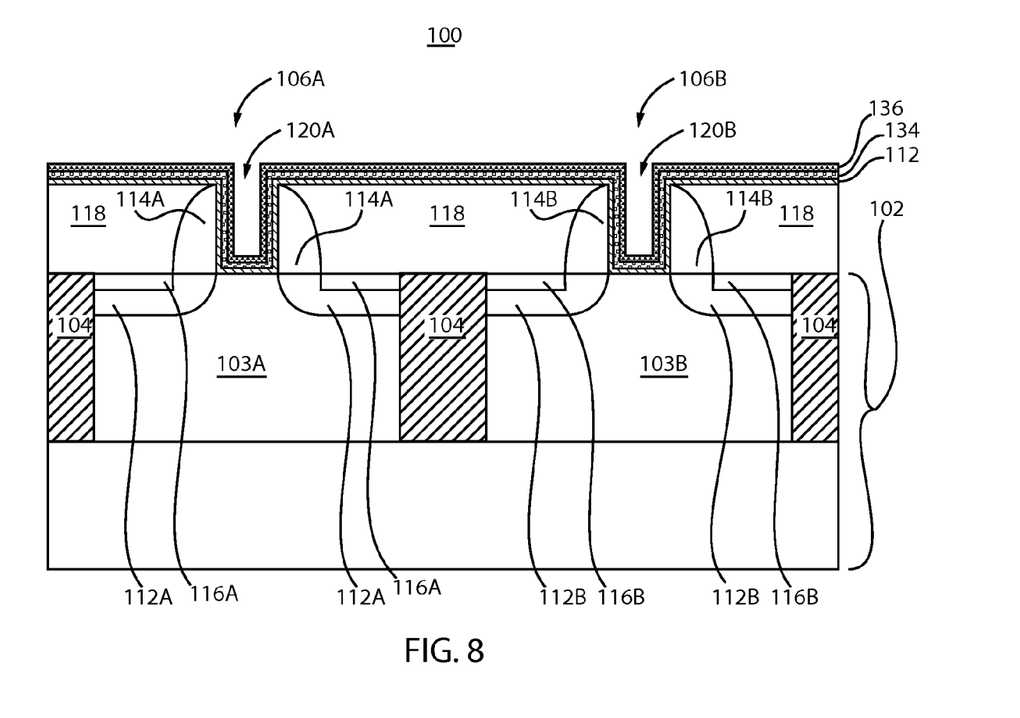
FIG. 8 is a cross-sectional view of the semiconductor structure having a semiconductor layer, formed over a diffusion barrier cap layer, formed over the dielectric layer, in accordance with one illustrative embodiment.

Referring now to FIG. 8, a diffusion barrier cap layer 134 and a semiconductor layer 136 are sequentially deposited over the device 100. The diffusion barrier cap layer 134 may include a metallic material that prevents outdiffusion of material during the subsequent anneal step. The diffusion barrier layer 134 preferably includes titanium nitride (TiN), however other suitable material may be employed, such as, e.g., a metal nitride or metal carbide. The diffusion barrier cap layer 134 may be deposited by, e.g., PVD, CVD, ALD, etc. The thickness of the diffusion barrier cap layer 134 can range from, e.g., 1 nm to 20 nm, measured at horizontal portions, although other thicknesses may also be employed.

The semiconductor layer 136 may include a semiconductor material, such as, e.g., silicon or germanium. Preferably, the semiconductor layer 136 includes amorphous silicon. The semiconductor layer 136 is deposited by, e.g., CVD. The thickness of the semiconductor layer 136 can range from, e.g., 2 nm to 40 nm, measured at horizontal portions, although other thicknesses may also be employed. The gate cavities 120A, 120B are not completely filled at this stage so that the inner surfaces of the semiconductor layer 132 are physically exposed within the gate cavities 120A, 120B.

A second anneal (not shown) is performed at an elevated temperature. The anneal is preferably a rapid thermal anneal (RTA) performed at a temperature ranging, e.g., from 950° C. to 1,050° C., although other temperatures may also be employed. The second anneal serves three purposes. First, additional metal material from metal containing layer 128 (e.g., La2O3) is further diffused through the second layer of the gate dielectric layer 122 and into the first layer, which is formed below the second layer, of the gate dielectric layer 122. Secondly, the second anneals provides slight SiO2 regrowth to create undoped SiO2 portions on the silicon channel. Thirdly, the second anneal results in a reduction in the amount of N in the interfacial in the second device region 106B from the diffusion barrier layer 134 (e.g., TiN) and first anneal, thereby improving negative bias temperature instabilities (NBTI).

The second anneal results in three layers of gate dielectric layer 122. In the first device region 106A, the gate dielectric layer 122 includes a bottom undoped SiO2 layer on the silicon channel, a middle layer (e.g., LaSiON), and a top layer (e.g., HfLaON). The La incorporation is a result of the diffusion of the elements of the metal containing layer 128 (e.g., La2O3), which partially diffuses during the first anneal and further diffuses during the second anneal. The N incorporation is a result of the diffusion from the diffusion barrier layer 134 (e.g., TiN). In the second device region 106B, the gate dielectric layer 122 includes a bottom undoped SiO2 layer on the silicon channel, a middle layer (e.g., SiON), and a top layer (e.g., HfON). The La is not incorporated due to the diffusion barrier layer 128. The N is incorporated as a result of the diffusion from the diffusion barrier layer 134 (e.g., TiN), but the total amount of N is reduced as a result of the second anneal.

Figure 9:
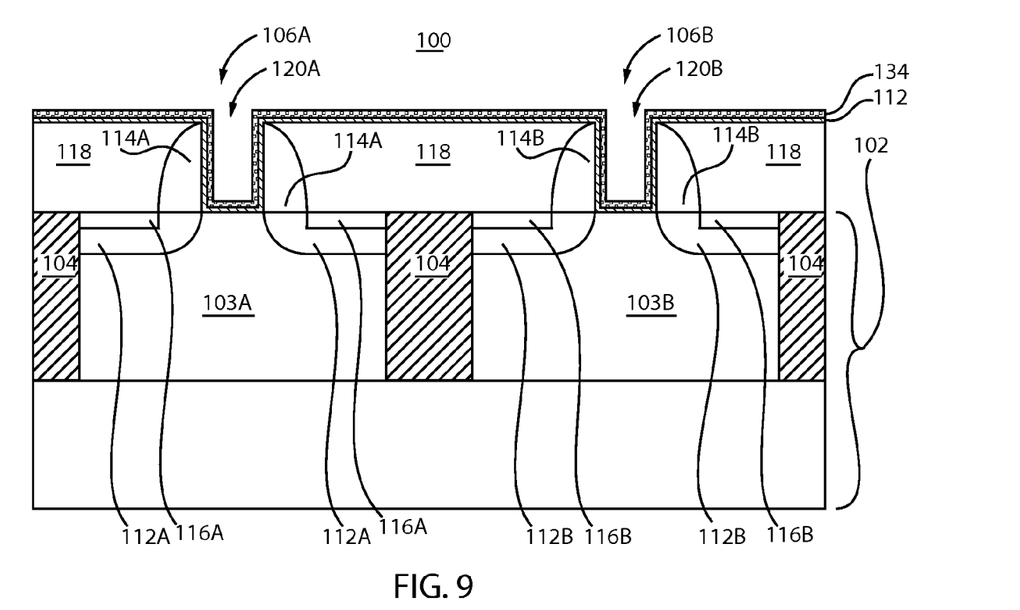
FIG. 9 is a cross-sectional view of the semiconductor structure having the semiconductor layer and the diffusion barrier cap layer removed, in accordance with one illustrative embodiment.

Referring now to FIG. 9, the semiconductor layer 136 is removed by etching, e.g., wet etch, dry etch, etc.

Figure 10:
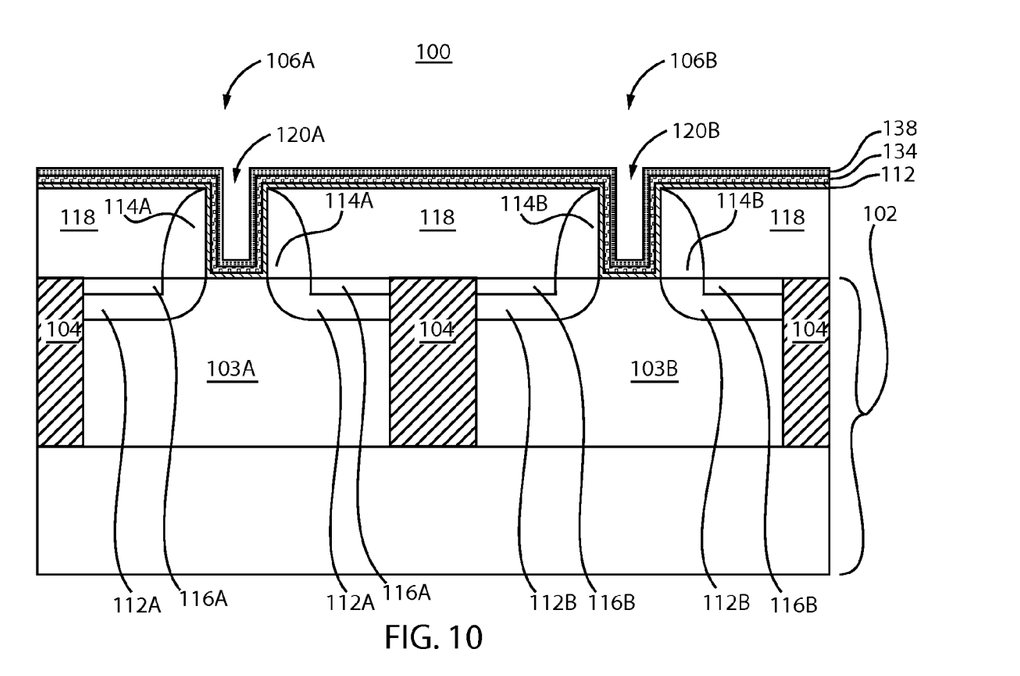
FIG. 10 is a cross-sectional view of the semiconductor structure having a first work function layer, in accordance with one illustrative embodiment.

Referring now to FIG. 10, a first work function layer 138 is deposited over the diffusion barrier layer 134 of device 100. The first work function layer 138 is formed of a material having a first work function and can be selected from any work function material as known. In a preferred embodiment, the first work function layer 138 is formed of titanium nitride (TiN). However, other types of materials may be employed for the first work function layer 128. The first work function layer 128 may be deposited by, e.g., ALD. The thickness of the first work function layer 128 can range from, e.g., 1 nm to 30 nm, although other thicknesses may also be employed.

Figure 11:
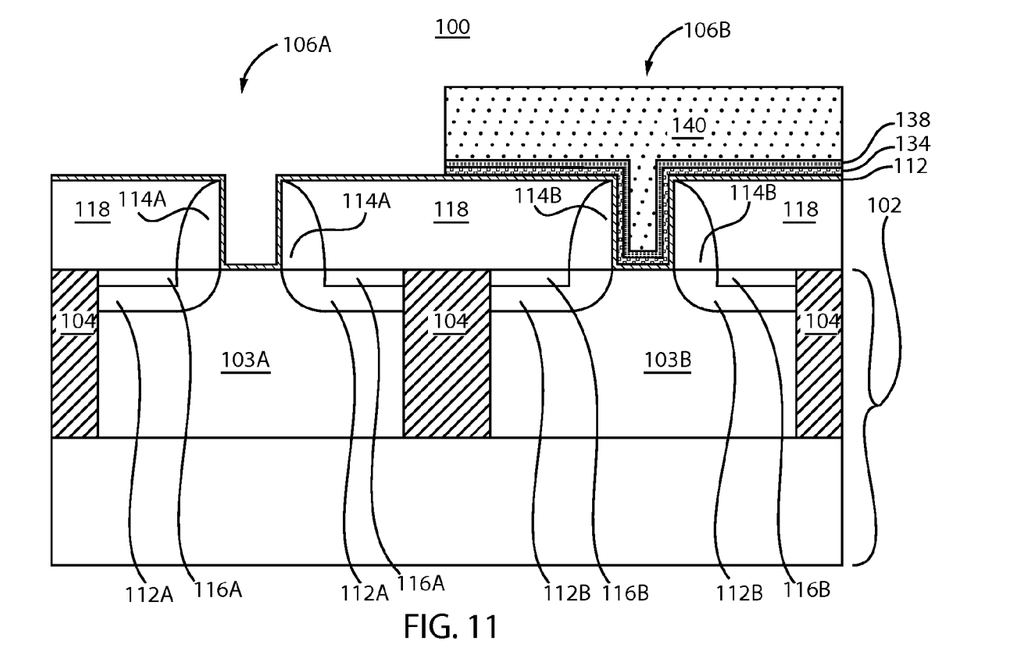
FIG. 11 is a cross-sectional view of the semiconductor structure having the first work function layer lithographically patterned, in accordance with one illustrative embodiment.

Referring now to FIG. 11, a photoresist layer 140 is lithographically patterned (e.g., exposure and development) to mask the second device regions 106B, while the first device regions 106A remains exposed. The photoresist layer 140 is employed as a mask to etch exposed portion of the first work function layer 138 and the diffusion barrier layer 134 in the first device regions 106A. The photoresist layer 140 is subsequently removed, e.g., by ashing.

Figure 12:
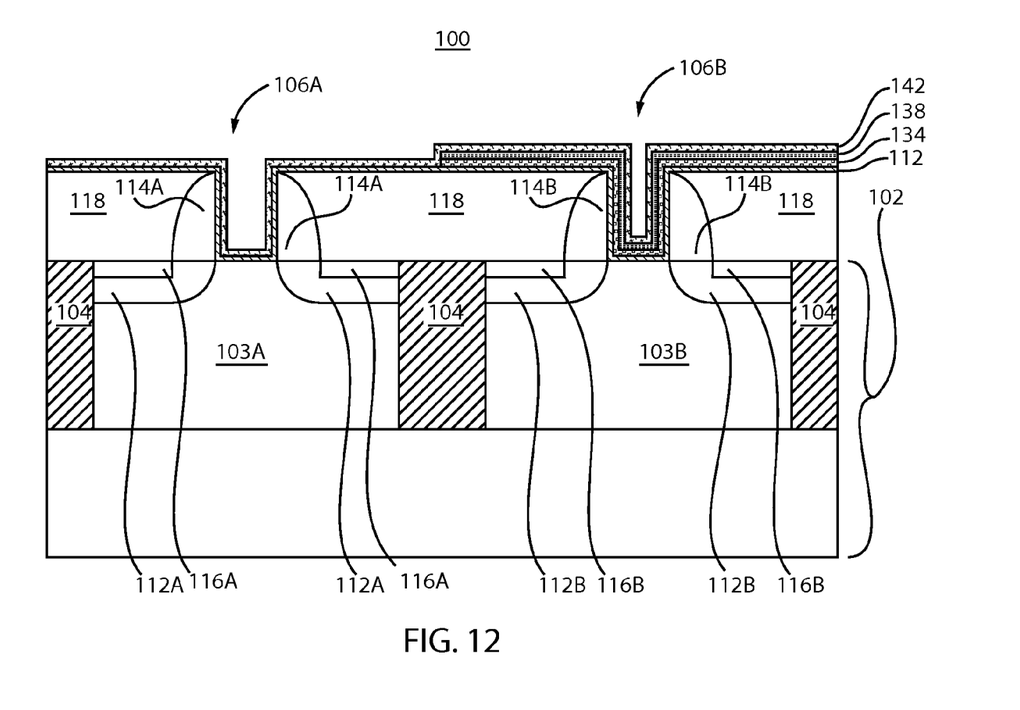
FIG. 12 is a cross-sectional view of the semiconductor structure having a second work function material, in accordance with one illustrative embodiment.

Referring now to FIG. 12, a second work function layer 142 is deposited over the device 100. The second work function layer 142 is formed of a material having a second work function and can be selected from any work function material as known. In a preferred embodiment, the second work function layer 142 includes at least one of titanium nitride (TiN) and TiAlC. It should be understood that the second work function layer 142 may include any other suitable material. The second work function layer 142 may be deposited by, e.g., ALD. The thickness of the second work function layer 142 can range from, e.g., 1 nm to 30 nm, although other thicknesses may also be employed.

Figure 13:
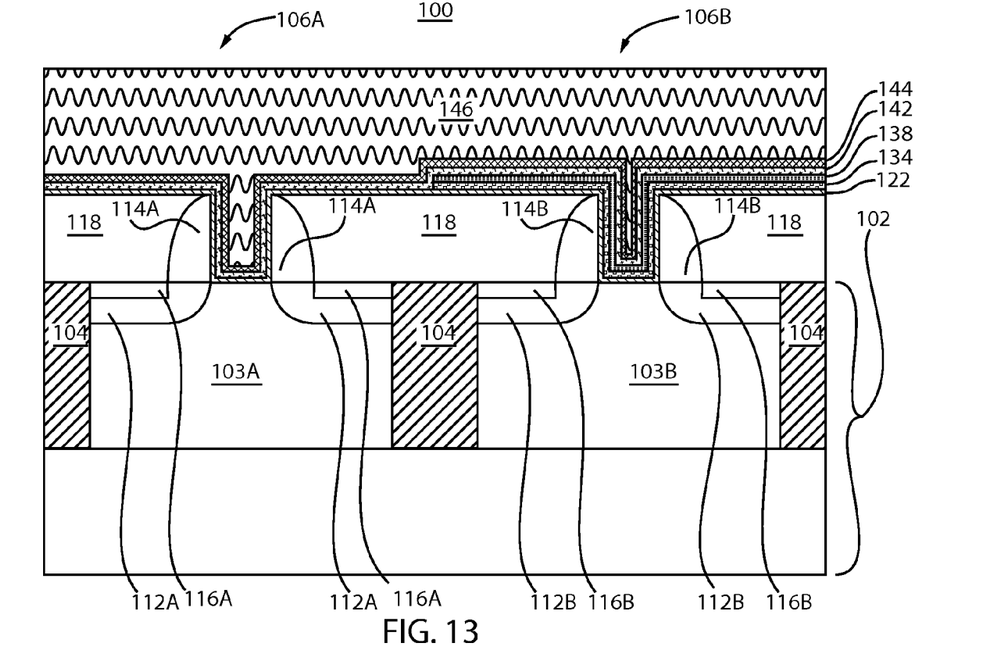
FIG. 13 is a cross-sectional view of the semiconductor structure having a diffusion barrier cap layer and conductive layer, in accordance with one illustrative embodiment.

Referring now to FIG. 13, a barrier metal layer 144 is deposited over the device 100. The barrier metal layer 144 preferably includes titanium nitride. However, other material may also be employed, such as, e.g., tantalum nitride, titanium aluminum alloy, titanium carbide, tantalum carbide, etc. The thickness of the barrier metal layer 144 can range from, e.g., 0.5 nm to 20 nm, although other thicknesses may also be employed.

A conductive layer 146 is then deposited over the device 100. The conductive layer preferably includes tungsten (W). However, the conductive layer 146 may include any conductive material, such as, e.g., aluminum, aluminum alloy, tungsten alloy, etc. The conductive layer is formed by deposition, e.g., PVD, CVD, etc. The thickness of the conductive layer 146, as measured in a planar region above the top surface of the planarization dielectric layer 118, may range from, e.g., 100 nm to 500 nm, although other thicknesses may also be employed.

Figure 14:
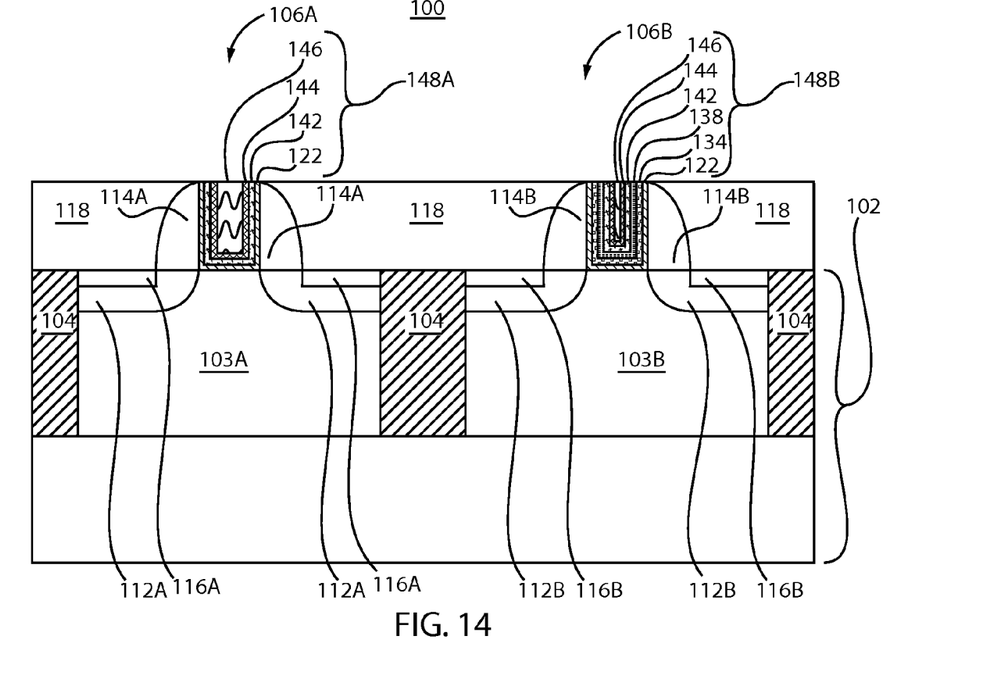
FIG. 14 is a cross-sectional view of the semiconductor structure having the device planarized to the top of the gate structure, in accordance with one illustrative embodiment.

Referring now to FIG. 14, portions of the conductive layer 146, barrier metal layer 144, second work function layer 142, first work function layer 138, diffusion barrier layer 134, and gate dielectric layer 122 are removed above the planarization dielectric layer 118 by employing a planarization process. Replacement gate stacks 148A, 148B are formed in the first and second device regions 106A, 106B, respectively.

First and second field effect transistors may be formed in the first and second device regions 106A, 106B. Preferably, the first field effect transistor is an n-type field effect transistor (nFET) and the second field effect transistor is a p-type field effect transistor (pFET) to form a complementary metal-oxide-semiconductor (CMOS) device.

The first field effect transistor may include a first well 103A, source/drain regions 112A, metal semiconductor alloy portions 116A, and a first replacement gate stack 148A. The first replacement gate stack 148A includes a gate dielectric layer 122, a second work function layer 142, a barrier metal layer 144, and a gate conductor from conductive layer 146.

The second field effect transistor may include a second well 103B, source/drain regions 112B, metal semiconductor alloy portions 116B, and a second replacement gate stack 148B. The second replacement gate stack 148B includes a gate dielectric layer 122, a diffusion barrier layer 134, a first work function layer 138, a second work function layer 142, a barrier metal layer 144, and a gate conductor from conductive layer 146.

Figure 15:
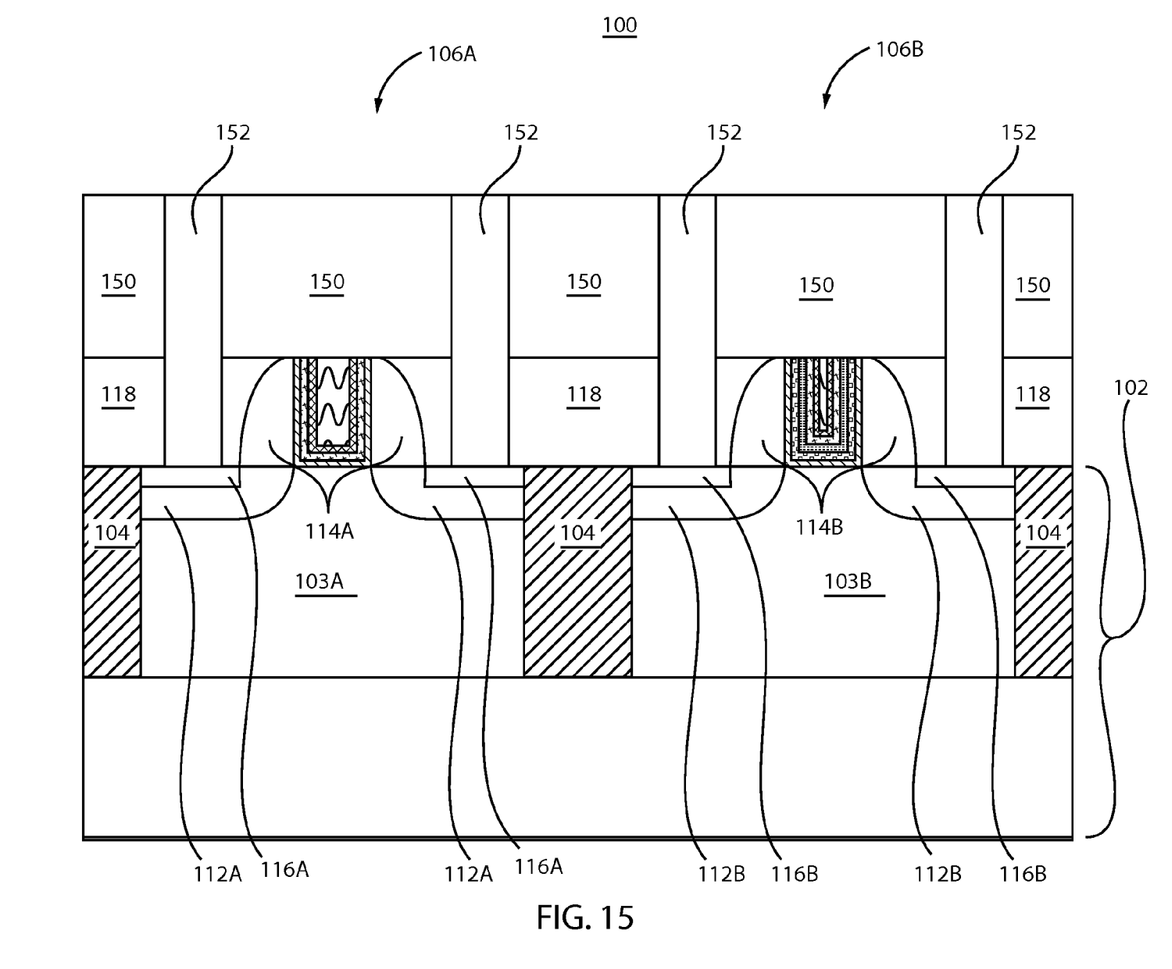
FIG. 15 is a cross-sectional view of the semiconductor structure having a contact level dielectric with contact vias, in accordance with one illustrative embodiment.

Referring now to FIG. 15, processing of the semiconductor device 100 may continue by depositing dielectric layer 150 over planarization dielectric layer 118. Various contract via structures may be formed by, e.g., lithographically patterning and etching cavities, depositing conductive material (e.g., tungsten) in the cavities, and planarizing. The contact structures may include source/drain contact structures 152. Other contact structures may also be employed, such as, e.g., gate contact structures. Processing may continue to form additional structures of features.

One advantage of the present principles is that an additional anneal is incorporated at a metal gate deposition step after incorporation of La2O3, which helps mitigate the mobility degrade due to the La2O3/SiO2 dipole, by additional SiO2 regrowth to move the dipole position further away from the interface. This additional anneal also enables a reduction in the amount of nitrogen incorporated into the interfacial layer on the pFET, thereby helping develop a comprehensive performance and reliability enhancing solution for replacement gate structures. Experimental results have shown that the present principles enable up to about 180 mV threshold voltage shift by incorporating La, with no mobility degradation for nFETs. For pFETs, nitrogen penetration is suppressed compared to a conventional stack, resulting in NBTI improvement.

Figure 16:
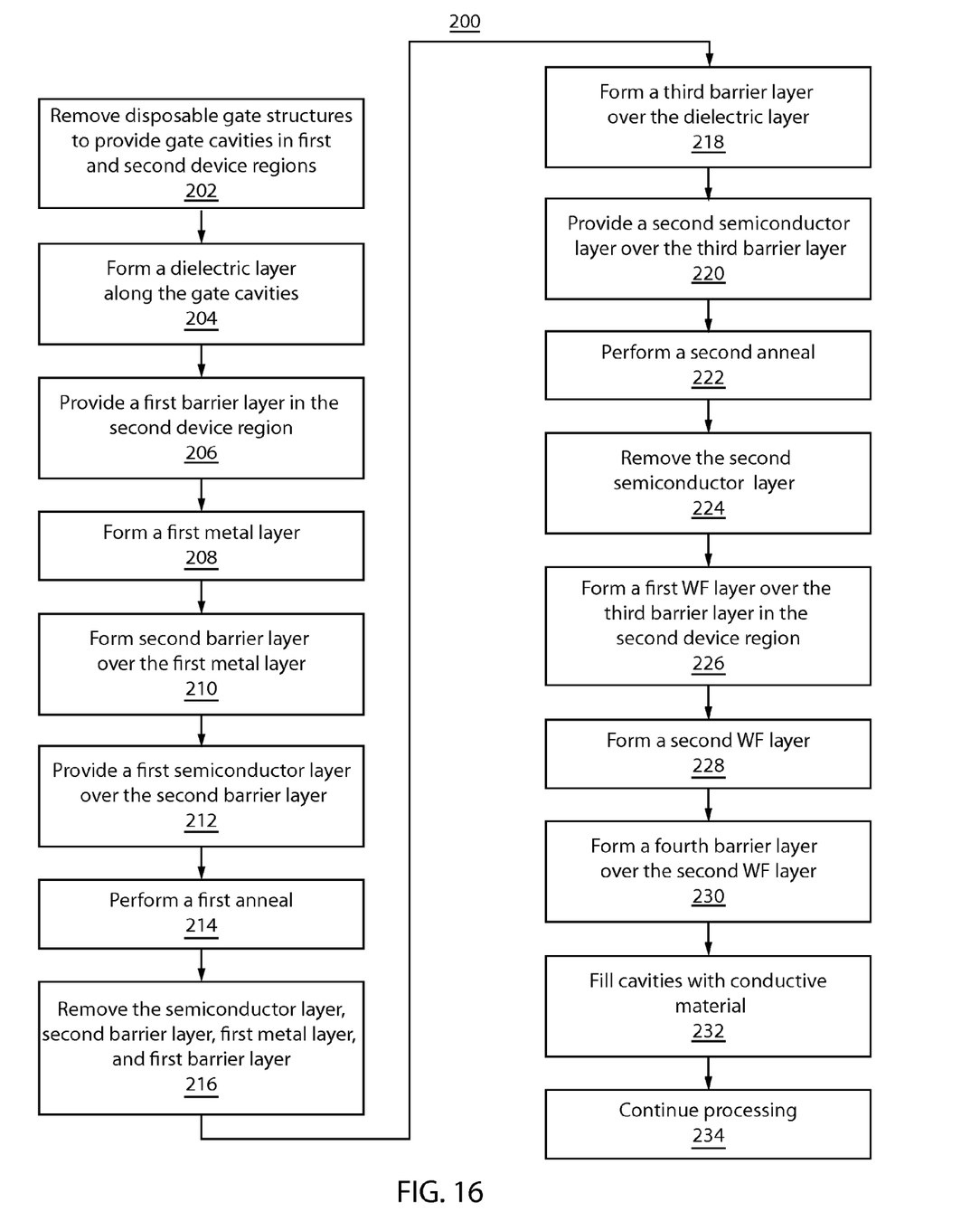
FIG. 16 is a block/flow diagram showing a system/method for fabricating a semiconductor, in accordance with one illustrative embodiment.

Referring now to FIG. 16, a block/flow diagram showing a method for fabricating devices have enhanced reliability and mobility 200, in accordance with one illustrative embodiment. In block 202, disposable gate structures are removed to provide gate cavities in first and second device regions. Preferably, the first device region is for an nFET device and the second device region is for a pFET device. In block 204, a dielectric layer is formed along the gate cavities. Specifically, the dielectric layer may be formed along the sidewall spacers and a bottom channel side. The bottom channel side may include an additional dielectric (if present) or silicon from the substrate. In a preferred embodiment, the dielectric layer includes a first (e.g., SiO2) sub-layer and a second (e.g., HfO2) sub-layer formed above the first layer. The first and second sub-layers may include any other suitable dielectric material.

In block 206, a first barrier layer is provided in the second device region. This may include lithographically patterning and etching. The first barrier layer preferably includes TiN, however may include any other suitable material. In block 208, a first metal containing layer is provided over the dielectric layer in the first device region and the first barrier layer in the second device region. The first metal containing layer is preferably a metal oxide layer, e.g., La2O3, however may include any other suitable material. In block 210, a second barrier layer (e.g., TiN) is formed over the first metal containing layer. In block 212, a first semiconductor layer is provided over the second barrier layer. The first semiconductor layer is preferably amorphous silicon.

In block 214, a first anneal is performed. The first anneal is preferably an RTA to diffuse La and N from the La2O3 (metal containing layer) and TiN (second barrier layer) into the HfO2 (second sub-layer) and at least a portion of the SiO2 (first sub-layer) of the dielectric layer in the first device region. The first barrier layer in the second device region acts as a diffusion barrier preventing the diffusion of La2O3 into the dielectric layer. Thus, only the N of the TiN (first barrier layer) diffuses into the HfO2 and at least a portion of the SiO2 of the dielectric layer in the second device region. In block 216, the semiconductor layer, second barrier layer, first metal containing layer and first barrier layer are removed by etching.

In block 218, a third barrier layer is formed over the remaining dielectric layer. Preferably, the third barrier layer includes TiN. In block 220, a second semiconductor layer is provided over the third barrier layer. In block 222, a second anneal (e.g., RTA) is performed. The second anneal provides additional diffusion of La and N into the dielectric layer and causes SiO2 regrowth to provide an undoped Sio2 portion of the dielectric layer. The second anneal results in a three layer dielectric layer after the diffusion of La and N. In the first device region, the dielectric layer includes an HfLaON layer, formed above an LaSiON layer, which is formed above the undoped SiO2 layer. In the second device region, the dielectric layer includes an HfON layer, formed above an SiON layer, which is formed above the undoped SiO2 layer.

In block 224, the second semiconductor layer is removed by, e.g., etching. In block 226, a first work function layer is formed over the third barrier layer in the second device region. This may include lithographically patterning to etch the first work function layer in the first device region. Both the first work function layer and the third barrier layer are removed. The first work function layer is formed of a material having a first work function, such as, e.g., TiN. In block 228, a second work function layer is formed over the dielectric layer in the first device region and the first work function layer in the second device region. The second work function layer is formed of a material having a second work function, such as, e.g., TiN or TiAlC. In block 230, a fourth barrier layer is formed over the second work function layer. The fourth barrier layer preferably includes TiN. In block 232, gate cavities are filled with conductive material, such as tungsten. In block 234, processing may continue to planarize the device, form second level dielectric regions, form via contacts, etc.

Having described preferred embodiments of a system and method enabling enhanced reliability and mobility for replacement gate planar and FINFET structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for semiconductor fabrication, comprising:
   forming at least one of a diffusion barrier layer and a metal containing layer over a dielectric layer in a gate cavity;
   performing a first anneal to diffuse elements from the at least one of the diffusion barrier layer and the metal containing layer into the dielectric layer;
   removing the metal containing layer and the diffusion barrier layer;
   forming at least one of a cap semiconductor layer and a second cap diffusion barrier layer on the dielectric layer after removing said metal containing layer and the diffusion barrier layer; and
   performing a second anneal after forming said at least one of the cap semiconductor layer and the second cap diffusion barrier layer to adjust diffusion of the elements in the dielectric layer to provide a gate dielectric region.

2. The method as recited in claim 1, wherein forming includes:
   forming a second diffusion barrier layer over the metal containing layer over the dielectric layer in a first device region; and
   forming the diffusion barrier layer over the dielectric layer in a second device region.

3. The method as recited in claim 2, wherein performing the first anneal includes performing the first anneal to diffuse elements:
   from the second diffusion barrier layer and the metal containing layer into the dielectric layer in the first device region; and
   from the diffusion barrier layer into the dielectric layer in the second device region.

4. The method as recited in claim 1, further comprising:
   forming a first semiconductor layer over a first cap diffusion barrier layer over the metal containing layer before performing the first anneal; and
   removing the first semiconductor layer and the first cap diffusion barrier layer after performing the first anneal.

5. The method as recited in claim 1, further comprising
   removing the cap semiconductor layer after performing the second anneal.

6. The method as recited in claim 1, wherein the dielectric layer includes a hafnium oxide (HfO2) layer formed over a silicon dioxide (SiO2) layer.

7. The method as recited in claim 6, wherein performing the first anneal includes performing the first anneal to diffuse the elements through the HfO2 layer and at least partially though the SiO2 layer.

8. The method as recited in claim 7, wherein performing the second anneal includes performing the second anneal to regrow at least a portion of the SiO2 layer.

9. The method as recited in claim 1, wherein the metal containing layer includes lanthanum oxide (La2O3) and the diffusion barrier layer includes titanium nitride (TiN).

10. The method as recited in claim 1, further comprising forming at least one workfunction material layer on the dielectric layer.

11. The method as recited in claim 10, further comprising forming a conductive layer over the at least one work function material layer to form a replacement gate stack.

12. A method for semiconductor fabrication, comprising:
   forming a dielectric layer in gate cavities associated with first and second device regions;
   forming a second diffusion barrier layer over a metal containing layer over the dielectric layer in the first device region, and a first diffusion barrier layer over the dielectric layer in the second device region;
   performing a first anneal to diffuse elements from the second diffusion barrier layer and the metal containing layer into the dielectric layer in the first device region, and from the first diffusion barrier into the dielectric layer in the second device region;
   removing the second diffusion barrier, the metal containing layer, and the first diffusion barrier;
   forming at least one of a cap semiconductor layer and a second cap diffusion barrier layer over the dielectric layer after removing said second diffusion barrier, the metal containing layer, and the first diffusion barrier; and
   performing a second anneal after said forming of said at least one of the cap semiconductor layer and the second cap diffusion barrier layer to adjust diffusion of the elements in the dielectric layer to provide a gate dielectric region.

13. The method as recited in claim 12, wherein the dielectric layer includes a hafnium oxide (HfO2) layer formed over a silicon dioxide (SiO2) layer.

14. The method as recited in claim 12, wherein the metal containing layer includes lanthanum oxide (La2O3) and the first and second diffusion barrier layers include titanium nitride (TiN).

* * * * *